United States Patent [19]

Kondoh et al.

[11] Patent Number: 4,757,028
[45] Date of Patent: Jul. 12, 1988

[54] PROCESS FOR PREPARING A SILICON CARBIDE DEVICE

[75] Inventors: Yasushi Kondoh; Yutaka Hayashi; Tetsuo Takahashi, all of Ibaraki, Japan

[73] Assignee: Agency of Industrial Science and Technology, Tokyo, Japan

[21] Appl. No.: 914,498

[22] Filed: Oct. 2, 1986

[30] Foreign Application Priority Data

Oct. 7, 1985 [JP] Japan ................ 60-222954

[51] Int. Cl.$^4$ ............... H01L 21/441; H01L 29/04; H01L 29/161; H01L 29/48
[52] U.S. Cl. ................... 437/40; 437/100; 437/192; 437/193; 437/233; 148/DIG. 148
[58] Field of Search ............. 357/61; 148/DIG. 148, 148/DIG. 147; 437/40, 100, 233, 192, 193, 238, 239, 241, 242, 255

[56] References Cited

U.S. PATENT DOCUMENTS

| | | | |
|---|---|---|---|
| 3,968,562 | 7/1976 | Van Lierop | 29/571 |
| 3,982,262 | 9/1976 | Karatsjuba et al. | 357/17 |
| 4,545,116 | 10/1985 | Lau | 29/591 |
| 4,581,815 | 4/1986 | Cheung et al. | 29/577 C |

FOREIGN PATENT DOCUMENTS

| | | | |
|---|---|---|---|
| 3434727 | 4/1985 | Fed. Rep. of Germany | 29/571 |
| 3446961 | 7/1985 | Fed. Rep. of Germany | 29/571 |

OTHER PUBLICATIONS

Suzuki et al., "Thermal Oxidation of SiC ...", Jap. J. Appl. Phys., V. 21 (Apr., 1982), pp. 579–585.
Jackson, Jr. et al., "Fabrication of Epitaxial SiC ...", Transactions Met. Soc. of AIME, V. 233 (Mar. 1965), pp. 468–472.
Campbell, "Whatever Happened to Silicon Carbide", IEEE Transactions Ind. Electron., v. IE-29 (May, 1982), pp. 124–128.
Experimental 3C-SiC MOSFET, Y. Kondo et al., IEEE Electron device letters, vol. EOL-7, No. 7, Jul. 1986.
Experimental fabrication of B-SiC MOSFET, Y Kondo et al., Apr. 24, 1986.

Primary Examiner—Olik Chaudhuri
Attorney, Agent, or Firm—Saidman, Sterne, Kessler & Goldstein

[57] ABSTRACT

A silicon carbide layer(s) is provided on a silicon substrate. If necessary, a desired pattern of the silicon carbide layer(s) is allowed to remain, while the other portion(s) is embedded with SiO$_2$. If necessary, the silicon carbide layer(s) may be constituted of a barrier layer and a device-forming layer. A layer capable of easily forming an insulating layer, such as a polycrystalline silicon layer, is provided on the silicon carbide layer to form first electrodes, followed by insulation of the surface, such as oxidation of the surfaces of the first electrodes and the silicon carbide layer. Second electrodes are further formed in self alignment by utilizing the insulating layer of the surface of the first electrodes. This process is useful in preparation of a silicon carbide device capable of operation at high temperatures.

9 Claims, 5 Drawing Sheets

PROCESS FOR PREPARING A SILICON CARBIDE DEVICE

BACKGROUND OF THE INVENTION

1. Field of the Invention

The present invention relates to a process for preparing a silicon carbide (SiC) device capable of operating at high temperatures.

2. Description of the Prior Art

SiC is a semiconductor capable of operation at high temperatures. The technique of growing SiC on a silicon (Si) substrate has recently been rapidly developed. It includes, for example, a chemical vapor deposition growth method according to which SiC of 5 to 10 $\mu$m can be grown from $SiH_4$ and $C_3H_8$ on an Si substrate having a surface with Miller indice of (100). However, a large strain is built up in the grown SiC film due to differences in thermal expansion coefficient and lattice constant between the Si substrate and SiC. This leads to cracking of the SiC film in the subsequent procedure of preparing a device. Thus, in this case, the preparation of such a device is difficult. Further, evaluation of electrical characteristics of SiC involves such an inconvenience that a thin SiC film obtained by dissolving the Si substrate must be used.

On the other hand, where an $SiO_2$ film obtained by oxidizing the surface of SiC is utilized as an insulating layer, it is known that difficulty is encountered in obtaining a sufficiently thick $SiO_2$ film due to the oxidation rate of SiC which is by far slower as compared with Si. Accordingly, it has been anticipated that a difficulty might be encountered in preparing devices such as a MOS transistor, for example, because of difficulties in attaining insulation of wirings.

SUMMARY OF THE INVENTION

An object of the present invention is to provide a process which can provide a good SiC device such as a field effect transistor (FET). The substrate of the device is free from cracking which is liable to appear in SiC grown on an Si substrate. The substrate has an oxide film thick enough to secure insulation of wirings which is necessary for evaluation of electrical characteristics and preparation of devices, as well as insulation necessary for isolation of devices.

Another object of the present invention is to provide a process for preparing a SiC device having a so-called self-aligned structure capable of automatically determining a distance between a gate and a source/drain by the thickness of an insulating the film formed on a material capable of insulating film to be formed.

A further object of the present invention is to provide a process for preparing an SiC device capable of operation at high temperatures on a Si substrate while electrically isolating the SiC device region from the Si substrate which has an increased electrical conductivity when the SiC device operates at high temperatures.

In the first aspect of the present invention, a process for preparing a substrate for a silicon carbide device, comprises the steps of:

growing a first silicon carbide layer(s) for forming a barrier on a silicon substrate; and growing a second silicon carbide layer(s) for forming a device on the surfaces(s) of the first silicon carbide layer(s).

Here, the second silicon carbide layer(s) on the surface(s) of the first silicon carbide(s) may be made of n-type cubic-SiC. The first silicon carbide layer(s) may be made of p-type cubic-SiC and made of p-type hexagonal-SiC.

The second silicon carbide layer(s) on the surface(s) of the first silicon carbide layer(s) may be made of p-type cubic-SiC. The first silicon carbide layer(s) may be made of n-type cubic-SiC and made of hexagonal-SiC.

The first silicon carbide layer(s) may be made of cubic-SiC, hexagonal-SiC, or a mixture of cubic-SiC and hexagonal-SiC, and may have a pn junction inside the same.

In the second aspect of the present invention, a process for preparing a silicon carbide device, comprises the steps of:

partially removing a silicon carbide layer(s) grown on a silicon substrate to partially expose a surface(s) of the silicon substrate;

forming a silicon oxide film(s) in the remaining surface(s) of the silicon carbide layer(s) and the exposed surface(s) of the silicon substrate;

forming a device(s) in the surface(s) of the silicon carbide layer(s); and wiring the silicon carbide device(s) on the silicon oxide film(s) on the surface(s) of the silicon substrate.

Here, the silicon carbide layer(s) may include a layer(s) for forming a silicon carbide device on the surface(s) thereof.

The silicon oxide film(s) may be formed by thermal oxidation in an oxidizing gas atmosphere. The silicon oxide film(s) may be thicker on the surface(s) of the silicon substrate than on the surface(s) of the silicon carbide layer(s).

The silicon carbide layer(s) may be finely divided into islands.

Average cumulative strain in the surface of the silicon substrate may be relaxed.

The wiring may serve as mutual wiring of silicon carbide devices formed in the islands-like silicon carbide layer(s). The wiring may serve to extend the electrode(s) of a silicon carbide device(s) formed on the surface(s) of the silicon carbide layer(s).

In the third aspect of the present invention, a process for preparing a silicon carbide device, comprises the steps of:

depositing a first electrically conductive layer on a surface(s) of a silicon carbide layer(s) in an exposed necessary portion(s) thereof and a surface(s) of a peripheral portion thereof;

partially removing the first electrically conductive layer on the surface(s) of the silicon carbide layer(s) and exposing part of the surface of the silicon carbide layer;

forming an insulating layer(s) on the surface(s) of the first electrically conductive layer and the exposed surface(s) of the silicon carbide layer(s);

removing the resulting oxide layer(s) only on the silicon carbide layer(s), if necessary; and further depositing a second electrically conductive layer(s) on the insulating layer(s) or on the exposed silicon carbide layer(s).

Here, the insulating layer(s) may be formed by oxidizing the surface of the first electrically conductive layer and the exposed surface of the silicon carbide layer(s) and by nitridizing the surface of the first electrically conductive layer and the exposed surface of the silicon carbide layer(s).

The first electrically conductive layer may be polycrystalline silicon and may be silicide. The first electrically conductive layer may be tantalum or titanium.

The silicon carbide layer(s) and the peripheral portion may be present on the silicon substrate. The peripheral portion may be an oxide film of the substrate.

Further, the first electrically conductive layer may form ohmic contact with the silicon carbide layer(s), and the second electrically conductive layer may be deposited while leaving the insulating layer(s) on the surface(s) of the silicon carbide layer(s).

The first electrically conductive layer may exhibit rectifying characteristics between the first electrically conductive layer and the silicon carbide layer(s), and the second electrically conductive layer may be deposited while leaving the insulating layer(s) on the surface(s) of the silicon carbide layer(s).

The first electrically conductive layer may form a pn junction with the silicon carbide layer(s), and may contain a material(s) which diffuses into the silicon carbide layer(s) and forms a pn junction in the surface of the silicon carbide layer(s).

The first electrically conductive layer may form ohmic contact with the silicon carbide layer(s), and the second electrically conductive layer may be deposited after removing the insulating layer(s) only on the surface(s) of the silicon carbide layer(s) to form a rectifying junction with the silicon carbide layer(s).

The second electrically conductive layer may be made of tungsten, gold, or platinum in form a Schottkey junction with the silicon carbide layer(s) which may be made of doped polycrystalline silicon or silicide which gives pn characteristics with the silicon carbide layer(s).

Impurity may be introduced to form a pn junction in the surface of portion of the silicon carbide layer(s) on which the first electrically conductive layer is removed in advance.

The Above and other objects, effects, features and advantages of the present invention will become more apparent from the following description of preferred embodiments thereof taken in conjunction with the accompanying drawings.

DETAILED DESCRIPTION OF PREFERRED EMBODIMENTS

According to the present invention, in order to provide on a Si substrate a SiC device capable of operating at high temperatures, a middle SiC layer(s) is provided between the Si substrate and the SiC device layer. The middle SiC layer(s) serves as a barrier for electrical isolation of the SiC device(s) from the Si substrate.

The SiC region is finely divided to relax cumulative strain in the substrate which prevents the occurrence of cracking, while a thicker oxide film is formed on the Si substrate by utilizing the difference in oxidation rate between Si and SiC to provide a good insulating film for wiring.

Regions corresponding to source and drain electrodes are formed from a material capable of forming an oxide or nitride film on the surface.

The location of a gate is determined automatically between the source and the drain, and the gate electrode is insulated by the oxide or the nitride film on the source and the drain electrodes.

With reference to FIGS. 1A to 1D, description will now be given to a process for finely dividing the SiC region formed on a Si substrate to form islands of SiC suitable for preparation of a device.

A grown SiC layer(s) 2 having a thickness of, for example, 1 $\mu$m is prepared on an Si substrate 1 by the later-mentioned CVD method.

Figure 1A:
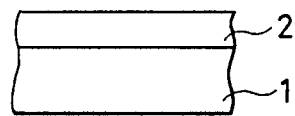
FIGS. 1A to 1D are cross-sectional views illustrating the process for preparing a substrate for a silicon carbide device according to the present invention.
Figure 1B:
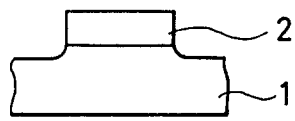

The SiC layer(s) 2 is partially etched with a photoresist mask by, for example, a plasma etching using $CF_4$ and $O_2$ gases to expose the Si substrate 1 as shown in FIG. 1B.

Figure 1C:
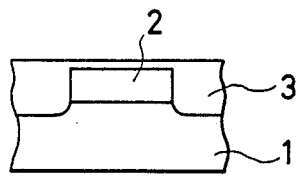

Subsequently, the resulting product is exposed to a high temperature oxidizing atmosphere to form an oxide film on the Si substrate 1 and the SiC layer(s) 2. For example, when it is exposed to a steam atmosphere of 1,150° C. for about 2 hours, 2 $SiO_2$ film 3 having substantially the same thickness as that of the SiC layer(s) 2 is obtained on the Si substrate, while an $SiO_2$ film having a thickness of merely about 100 nm is obtained on the SiC layer(s) 2 since SiC is stable. As a result, a substantially planar surface as shown in FIG. 1C is obtained. If necessary, the $SiO_2$ may be etched a little to expose the surface of the SiC layer(s) 2.

Figure 1D:
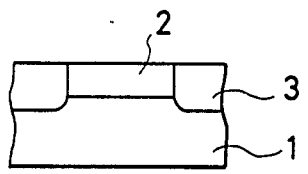

Thus, the SiC layer(s) 2 is finely divided into islands having a desired pattern as shown in FIG. 1D to relax cumulative strain along the whole surface of the substrate and prevent it from cracking. Further, such planer surface is effective for wiring of a deposited electrically conductive layer(s) which connects a SiC device(s) with another SiC device(s) on another SiC island(s) or with a peripheral part(s).

With reference to FIGS. 2A to 2E, description will now be given to a process for preparing a depletion type MOS field effect transistor (MOSFET) of SiC formed on Si.

Figure 2A:
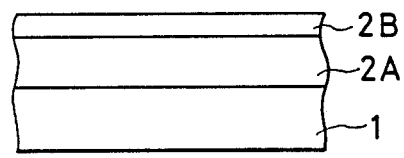
FIGS. 2A to 2E are cross-sectional views illustrating the process for preparing a depletion type MOSFET of silicon carbide according to the present invention.
Figure 2B:
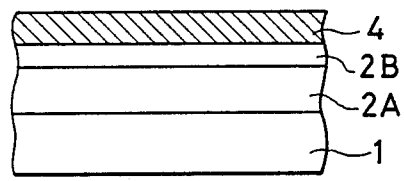

A Si substrate 1 having SiC grown as shown in FIG. 2A is prepared. It has a SiC layer 2B to be utilized as a device region and a SiC layer 2A to serve as a barrier for electrically isolating the SiC device region 2B from the Si substrate 1. For example, p-type cubic-SiC of 700 nm in thickness is grown as the layer 2A on a Si substrate 1 having a surface with Miller indices of (100) according to the chemical vapor deposition growth method using $SiH_4$ and $C_3H_8$, and $Al(C_2H_5)_3$ as a doping gas. The impurity concentration of the p-type SiC 2A is set to be, for example, $5 \times 10^{18} cm^{-3}$.

Subsequently, n-type cubic-SiC 2B of 300 nm in thickness is grown in substantially the same manner as described above except that no doping gas is introduced. When the abrupt junction approximation is used with an impurity concentration of n-type SiC 2B of, for example, $1 \times 10^{17} cm^{-3}$, a specific dielectric constant of 6.7, and a built-in potential in pn junction of SiC of 2 V, a depletion layer of about 100 nm may spread toward the n-type SiC 2B from the interface between the p-type SiC 2A and the n-type SiC 2B.

This depletion layer of pn junction of SiC electrically isolates the SiC device layer 2B from the Si substrate 1.

On the other hand, an n-type cubic-SiC and a p-type cubic SiC may be also utilized as the barrier SiC 2A and the SiC device layer 2B, respectively.

Hexagonal-SiC having a large width of forbidden band may be utilized as the barrier SiC layer 2A instead of cubic-SiC. For an n-type cubic-SiC device layer 2A, p-type hexagonal-SiC can be used as the barrier SiC layer. For a p-type cubic-SiC device layer, both p- and n-type hexagonal-SiC can be used as the barrier SiC layer because n-type region of the hexagonal SiC is formed in the proximity of the p-type cubic SiC.

A pn or pp (iso-type in the case of heterojunction) junction of cubic SiC, hexagonal SiC, or mixture of cubic SiC and hexagonal SiC may be also utilized as the barrier SiC layer(s) 2A.

Subsequently, islands of SiC as shown in FIG. 1 are formed if necessary.

Thereafter, an electrically conductive material 4 capable of easily forming an oxide or nitride film, such as Si, a metal silicide, Ta, or Ti, is deposited for use in formation of a source 4A and a drain 4B. In this case, the electrically conductive material 4 is selected to establish a good ohmic contact with the SiC device layer 2B. For example, polycrystalline Si 4 of 500 nm in thickness doped with phosphorus as a doner is deposited on the n-type SiC 2B according to the sputtering method or the electron beam evaporation and deposition method.

Figure 2C:
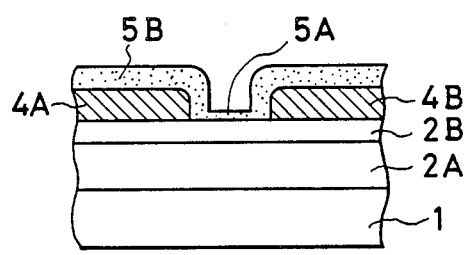

A portion corresponding to the gate electrode and other unnecessary portions of the polycrystalline Si layer 4 are removed for the purpose of using the polycrystalline Si layer 4 as the source electrode 4A and the drain electrode 4B (FIG. 2C). The removal of the polycrystalline Si may be effected by photoetching with, for example, a solution of HF—HNO$_3$ as the etchant.

Subsequently, an insulating film is formed on the surface as shown in FIG. 2C. For example, when the surface is thermally oxidized in a dry oxygen atmosphere of 1,000° C. for 2 hours, SiO$_2$ 5A of about 48 nm, which is to serve as the gate oxide film, is formed on the n-type SiC 2B, and SiO$_2$ 5B of about 160 nm, which is to serve as an insulating material of the source 4A and the drain 4B, is formed on the polycrystalline Si. Nitridization may be applicable depending on the electrically conductive material 4.

Phosphorus added to the source 4A and the drain 4B is slightly diffused into the SiC 2B during the thermal oxidation, resulting in establishment of good ohmic contact between the source 4A and the SiC 2B, as well as between the drain 4B and the SiC 2B.

Figure 2D:
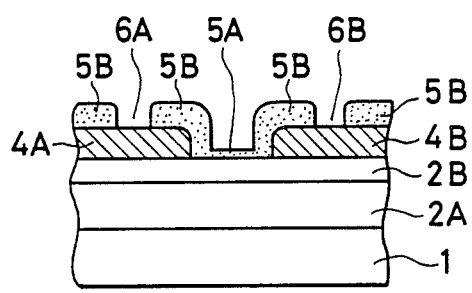

Subsequently, contact holes are formed in the insulating film 5B both on the source 4A and on the drain 4B, followed by providing gate electrode 7 and wirings 8A and 8B of the source or the drain. For example, formation of contact holes 6A and 6B as shown in FIG. 2D is effected by wet etching of the SiO$_2$ film 5B with a solution of buffered HF, followed by evaporation and deposition of, for example, Al as an electrode (wiring) metal in a thickness of 0.7 $\mu$m. The evaporation-deposited Al film is processed into a desired pattern by photoetching with, for example, a solution of H$_3$PO$_4$—HNO$_3$ as the etchant.

Polycrystalline Si, a refractory metal such as W or Mo, SiC, or the like may be used as a material of the gate electrode 7 and the wirings 8A and 8B for enabling operation at higher temperatures.

In this step, the position of the gate is determined equivalently in self alignment since the gate is superposed on the source 4A and the drain 4B previously formed via the insulating film thicker than that of the gate insulating film.

Figure 2E:
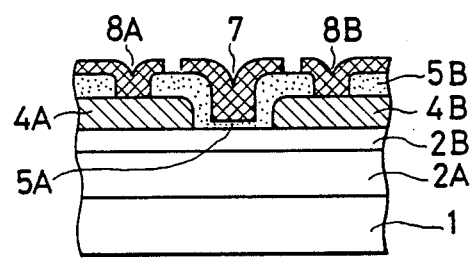

Thus, a depletion type MOSFET of SiC as shown in FIG. 2E is finished.

An enhancement type MOSFET of SiC can also be prepared in the same manner as described above. The process for preparing the same will now be described with reference to FIG. 3.

Detailed description will be dispensed with since the process is substantially the same as that for preparing a depletion type MOSFET as mentioned above. A difference of the former from the latter is that the source and drain electrodes 4A and 4B have rectifying characteristics with the SiC device layer 2B.

For example, in case that n-type SiC is used as the SiC device layer 2B, aluminum-doped polycrystalline Si is used as the source and drain electrodes 4A and 4B. Rectifying characteristics are obtained between the source/drain electrode and the SiC device layer 2B.

Figure 3:
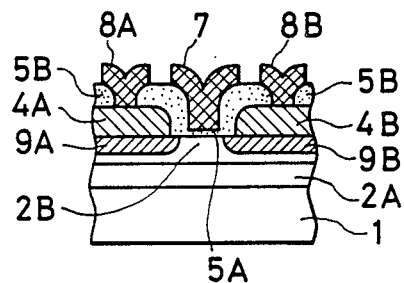
FIGS. 3 and 4 are cross-sectional views illustrating the process for preparing an enhancement type MOSFET of silicon carbide according to the present invention.

If annealed, aluminum in the source and drain electrode diffuses into the SiC device layer 2B, and thin p-type SiC layers 9A and 9B as shown in FIG. 3 are formed. Thus, rectifying characteristics are obtained in the surface of the SiC device layer 2B.

The other steps are the same as mentioned before. Thus, an enhancement type MOSFET is finished.

Figure 4:
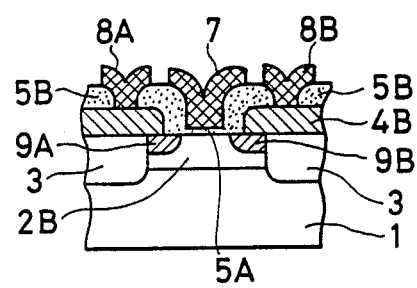

FIG. 4 is another example of enhancement type MOSFET. The structure of FIG. 4 has a SiO$_2$ film 3 obtained by oxidizing a Si substrate as described in connection with FIGS. 1A-1C. The SiC layer of the structure has no barrier SiC layer 2A, and is constituted of an SiC device layer 2B alone.

The source and drain electrodes 4A and 4B can be extended on the insulating layer 3 provided on the Si substrate as shown in FIG. 4. This decreases the area of the pn junction in the SiC layer to decrease the leak current and the stray capacity. Thus, the performance of the device can be improved.

Figure 5:
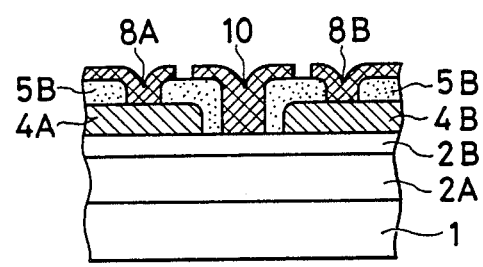
FIG. 5 is a cross-sectional view illustrating the process for preparing a MESFET of silicon carbide according to the present invention.

The process for preparing a MESFET in SiC will now be described with reference to FIG. 5.

Detailed description will be dispensed with since the process has many steps common with those in the process for preparing a depletion type MOSFET as shown in FIGS. 2A-2E. A difference of the former from the latter is that, after formation of insulating films 5A and 5B covering the surfaces of the SiC device layer 2B and the source and drain electrodes 4A and 4B, only the insulating film 5A formed on the SiC device layer 2B is removed by etching. In the case of the aforementioned oxidation method, the thickness of the film 5A is smaller than that of the film 5B. Therefore, only the film 5A can be etched with a buffered HF solution to expose the SiC device layer 2B.

Another difference is that gold, platinum, tungsten, or the like is used as a gate electrode 10 in forming a Schottky junction thereof with the SiC device layer 2B. Before formation of source and drain wirings 8A and 8B, a metal as mentioned above is deposited, for example, by the electron beam evaporation and deposition method and is processed by the photoetching method.

The other steps are the same as those in preparation of the aforementioned depletion type MOSFET. Thus, a depletion type MESFET is finished.

Figure 6:
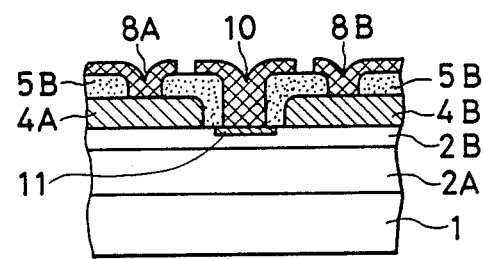
FIG. 6 is a cross-sectional view illustrating the process for preparing a junction FET of silicon carbide according to the present invention.

The process for preparing a junction FET in SiC will now be described with reference to FIG. 6.

Detailed description will be dispensed with since the processes has many steps common with those in the process for preparing an MESFET as mentioned before. A difference of the former from the latter is that, instead of the Schottky material, a conductive material is used as the gate electrode 10, which is capable of establishing a pn junction with the SiC device layer 2B. For example, when an n-type SiC is used as the SiC device layer 2B, aluminum doped polycrystalline silicon is utilized as the gate electrode 10. Rectifying characteristics are obtained between the SiC device layer 2B and the gate electrode 10. If annealed, aluminum contained in the gate electrode 10 slightly diffuses into the SiC device layer 2B, resulting in a thin p-type SiC layer 11 formed just below the gate electrode 10. Good rectifying characteristics between the SiC device layer 2B and the gate electrode 10 are obtained.

The other steps are the same as those in preparation of the above-mentioned MESFET. Thus, a junction FET is finished.

As another method to form a pn junction in the surface of the SiC device layer 2B, impurity is introduced in the surface of the SiC device layer 2B using the electrodes and the insulating layers on the electrodes as masks before the gate electrode 10 is deposited. In this case, the gate electrode 10 is not necessary to make a rectifying junction with the SiC device layer 2B because the impurity-introduced region 11 makes a pn junction with the SiC device layer 2B.

Figure 7:
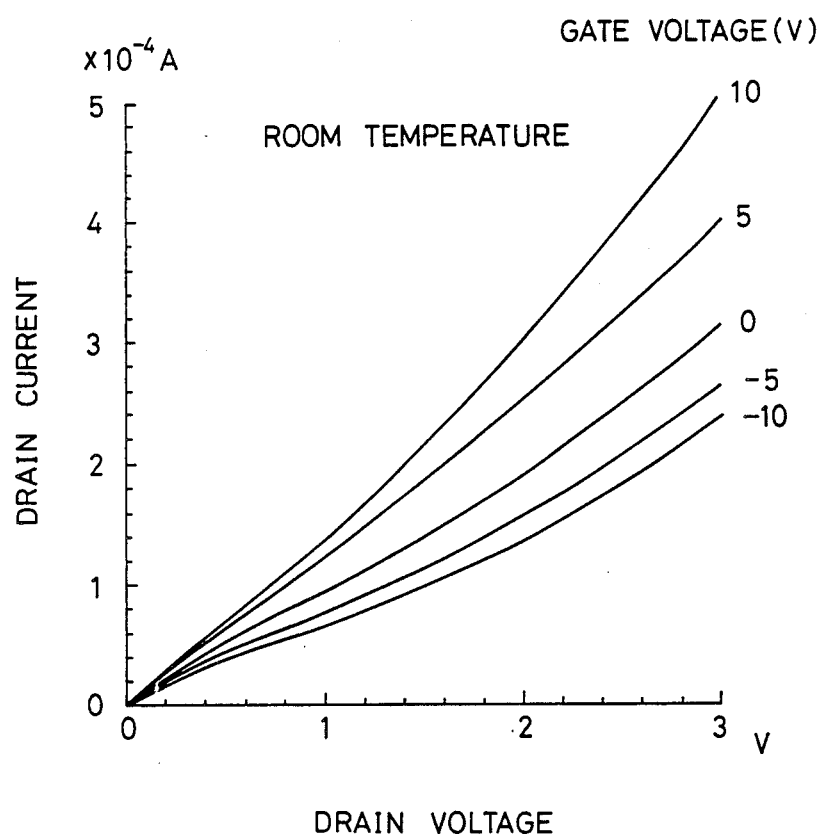
FIGS. 7 and 8 are diagrams showing the electrical characteristics of a MOSFET prepared according to the present invention.
Figure 8:
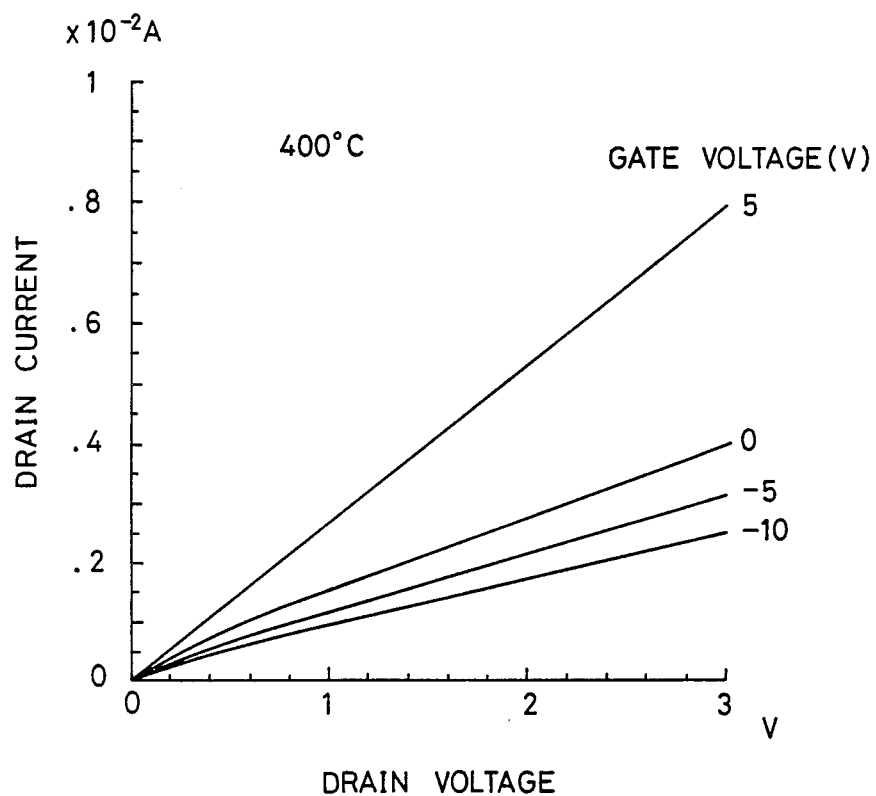

The current - voltage characteristics of the depletion type MOSFET of SiC prepared in the above-mentioned way are shown in FIGS. 7 and 8. FIG. 7 shows the current - voltage characteristics at room temperature, while FIG. 8 shows it at 400° C. Both the figures show a relationship between the drain current and the drain voltage with the gate voltage as a parameter. As is apparent from the figures, the MOSFET of SiC prepared according to the process of the present invention can operate even at 400° C.

What is claimed is:

1. A process for preparing a field effect transistor of silicon carbide, comprising the steps of:
   (a) depositing a first electrically conductive layer on the surface of a silicon carbide layer;
   (b) partially removing said first electrically conductive layer and exposing a surface of said silicon carbide layer to obtain two spaced apart regions of said first electrically conductive layer, said two spaced apart regions of the first electrically conductive layer constituting a source and a drain electrode of a field effect transistor of silicon carbide to be prepared, the space between said source electrode and said drain electrode defining in said silicon carbide layer a channel region of said field effect transistor;
   (c) forming insulating layers on surfaces of said source electrode, said drain electrode, and said exposed silicon carbide layer, wherein, owing to the differences in the formation rates of said insulating layers, said insulating layers on said exposed silicon carbide layer are thinner than those on said source and drain electrodes;
   (d) depositing a second electrically conductive layer on said insulating layers; and
   (e) partially removing said second electrically conductive layer in a pattern which leaves portions thereof remaining at least above said channel region to provide a gate electrode of said field effect transistor, said gate electrode being insulated from said source and said drain by said insulating layers.

2. The process for preparing a field effect transistor of silicon carbide of claim 1, wherein the method of forming said insulating layers is oxidation in an oxidizing gas atmosphere.

3. The process for preparing a field effect transistor of silicon carbide of claim 1, wherein the method of forming said insulating layers is nitridation in an nitridizing gas atmosphere.

4. The process for preparing a field effect transistor of silicon carbide of claim 1, wherein said first electrically conductive layer is polycrystalline silicon.

5. The process for preparing a field effect transistor of silicon carbide of claim 1, wherein said first electrically conductive layer is a silicide, and wherein said step (c) forms said insulating layers at a higher rate over said silicide than over said silicon carbide.

6. The process for preparing a field effect transistor of silicon carbide of claim 1, wherein said first electrically conductive layer comprises a metal selected from the group consisting of tantalum and titanium.

7. The process for preparing a field effect transistor of silicon carbide of claim 1, wherein said first electrically conductive layer has ohmic contact with said silicon carbide layer.

8. The process for preparing a field effect transistor of silicon carbide of claim 1, wherein said first electrically conductive layer has rectifying contact with said silicon carbide layer.

9. A process for preparing a field effect transistor of silicon carbide, comprising the steps of:
   depositing a first electrically conductive layer on the surface of a silicon carbide layer;
   dividing said first electrically conductive layer into two portions by partially removing said first conductive layer and exposing a surface of said silicon carbide layer, said two portions of first electrically conductive layer constituting a source and a drain electrode of a field effect transistor of silicon carbide to be prepared, the space between said source electrode and said drain electrode defining in said silicon carbide layer a channel region of said field effect transistor;
   forming insulating layers on surfaces of said source electrode, said drain electrode, and said exposed silicon carbide layer, wherein, owing to the differences in the formation rates of said insulating layers, said insulating layers on said exposed silicon caribde layer are thinner than those on said source and drain electrodes;
   removing said insulating layer only on said exposed silicon carbide layer to expose said silicon carbide layer again;
   depositing a second electrically conductive layer on said insulating layers, wherein second electrically conductive layer has rectifying contact with said silicon carbide layer; and
   partially removing said second electrically conductive layer in a pattern which leaves portions thereof remaining at least above said channel region to provide a gate electrode of said field effect transistor which is insulated from said source electrode and said drain electrode by said insulating layers.

* * * * *